US009712110B2

(12) United States Patent
Yamashita

(10) Patent No.: US 9,712,110 B2
(45) Date of Patent: Jul. 18, 2017

(54) RESONATOR ELEMENT, RESONATOR, RESONATOR DEVICE, OSCILLATOR, ELECTRONIC APPARATUS, AND MOVING OBJECT

(71) Applicant: Seiko Epson Corporation, Tokyo (JP)

(72) Inventor: Go Yamashita, Ina (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/005,280

(22) Filed: Jan. 25, 2016

(65) Prior Publication Data

US 2016/0226465 A1 Aug. 4, 2016

(30) Foreign Application Priority Data

Jan. 29, 2015 (JP) ................. 2015-015325

(51) Int. Cl.
*H03B 5/32* (2006.01)
*H03H 9/19* (2006.01)
*H03H 9/10* (2006.01)
*H03H 9/05* (2006.01)
*H03H 9/02* (2006.01)

(52) U.S. Cl.
CPC ............ *H03B 5/32* (2013.01); *H03H 9/1007* (2013.01); *H03H 9/19* (2013.01); *H03H 9/0538* (2013.01); *H03H 2009/02496* (2013.01)

(58) Field of Classification Search
CPC ...................................... H03B 5/32
USPC ......................................... 331/158
See application file for complete search history.

(56) References Cited

U.S. PATENT DOCUMENTS

| | | | |
|---|---|---|---|
| 2011/0095657 | A1 | 4/2011 | Yamashita et al. |
| 2012/0126668 | A1 | 5/2012 | Ii et al. |
| 2012/0181899 | A1 | 7/2012 | Koyama |
| 2012/0229223 | A1 | 9/2012 | Ii et al. |
| 2012/0235762 | A1* | 9/2012 | Ii ............... H03H 9/177 331/158 |

FOREIGN PATENT DOCUMENTS

| | | |
|---|---|---|
| JP | 2008-218951 A | 9/2008 |
| JP | 2010-041109 A | 2/2010 |
| JP | 2011-097183 A | 5/2011 |
| JP | 2012-114495 A | 6/2012 |
| JP | 2012-114496 A | 6/2012 |
| JP | 2012-165367 A | 8/2012 |

(Continued)

*Primary Examiner* — Joseph Chang
(74) *Attorney, Agent, or Firm* — Harness, Dickey & Pierce, P.L.C.

(57) ABSTRACT

A resonator element includes a quartz crystal substrate in which a plane including X and Z' axes is set as a main plane and a direction oriented along a Y' axis is a thickness direction. The quartz crystal substrate includes a first region in which thickness shear vibration is generated, a second region that has a thickness thinner than the first region, and first protrusions that are disposed between one pair of electrode pads disposed to be lined in a direction oriented along a Z' axis on a mounted side of the second region. When Lx is a length of the first protrusions along the X axis and λ is a wavelength of flexural vibration of the quartz crystal substrate, a relation of "$\lambda/2 \times (2n+1) - 0.1\lambda \leq Lx \leq \lambda/2 \times (2n+1) + 0.1\lambda$" (where n is a positive integer) is satisfied.

19 Claims, 14 Drawing Sheets

(56) References Cited

FOREIGN PATENT DOCUMENTS

| JP | 2012-191299 A | 10/2012 |
| JP | 2012-191300 A | 10/2012 |
| JP | 2013-085298 A | 5/2013 |
| JP | 2013-110658 A | 6/2013 |
| JP | 2014-116977 A | 6/2014 |

* cited by examiner

RESONATOR ELEMENT, RESONATOR, RESONATOR DEVICE, OSCILLATOR, ELECTRONIC APPARATUS, AND MOVING OBJECT

BACKGROUND

1. Technical Field

The present invention relates to a resonator element, a resonator, a resonator device, an oscillator, an electronic apparatus, and a moving object.

2. Related Art

In the related art, there are known resonator elements using quartz crystal. Such resonator elements are widely used as reference frequency sources, oscillation sources, or the like of various electronic apparatuses since frequency-temperature characteristics are excellent. In particular, since the frequency-temperature characteristics of resonator elements using quartz crystal substrates cut at cut angles called AT-cut show cubic curves, the resonator elements are widely used in mobile communication apparatuses such as mobile phones.

For example, JP-A-2012-114496 and JP-A-2012-114495 disclose AT-cut quartz crystal resonator elements which have multistage mesa structures and in which vibration sections which are mesa sections include first portions and second portions having thicknesses thinner than the first portions and integrated in the circumferences of the first portions in a plan view. Here, when Z is the size of an AT-cut substrate in a Z' axis, Mz is the size of the vibration section in the Z' axis, and t is the thickness of the first portion of the vibration section and relations of "8≤Z/t≤11" and "0.6≤Mz/Z≤0.8" are satisfied, it is possible to reduce the value of equivalent series resistance, so-called crystal impedance (CI).

JP-A-2012-191300 and JP-A-2012-191299 disclose AT-cut quartz crystal resonator elements having multistage mesa structures. Here, by forming protrusions on free end sides, a package and an excitation electrode formed in the vibration section are prevented from coming into contact with each other at the time of mounting on the package.

JP-A-2011-97183 discloses an AT-cut quartz crystal resonator element having a multistage mesa structure. Here, by forming protrusions so that a vibration section is interposed between the protrusions, flexural vibration is prevented.

In the foregoing resonator elements, however, when protrusions are formed at positions at which vibration displacement energy in the vibration sections is not sufficiently attenuated, vibrations of excitation portions are affected, and thus electric characteristics of the resonator elements may deteriorate in some cases.

SUMMARY

An advantage of some aspects of the invention is to provide a resonator element capable of reducing deterioration in electric characteristics. Another advantage of some aspects of the invention is to provide a resonator, a resonator device, an oscillator, an electronic apparatus, and a moving object including the resonator element.

The invention can be implemented as the following forms or application examples.

Application Example 1

A resonator element according to this application example includes: a quartz crystal substrate in which an X axis of an orthogonal coordinate system having the X axis serving as an electric axis, the Y axis serving as a mechanical axis, and the Z axis serving as an optical axis, which are crystallographic axes of quartz crystal, is set as a rotation axis, an axis inclined from the Z axis so that a +Z side is rotated in a −Y direction of the Y axis is set as a Z' axis, an axis inclined from the Y axis so that a +Y side is rotated in a +Z direction of the Z axis is set as a Y' axis, a plane including the X and Z' axes is set as a main plane, and the direction oriented along the Y' axis is set as a thickness direction; and a pair of electrode pads. The quartz crystal substrate includes a first region in which thickness shear vibration is generated, a second region that is located in periphery of the first region and has a thickness thinner than the first region, and a first protrusion that is disposed to be lined with the first region in a direction oriented along the X axis at one end side of the second region along the X axis. The one pair of electrode pads are disposed to be lined in a direction oriented along the Z' axis at the one end side of the second region in the direction oriented along the X axis. The first protrusion is present between the one pair of electrode pads. When Lx is a length of the first protrusion along the X axis and λ is a wavelength of flexural vibration generated in the quartz crystal substrate, a relation of "λ/2×(2n+1)−0.1λ≤Lx≤λ/2×(2n+1)+0.1λ" (where n is a positive integer) is satisfied.

In the resonator element, a distance between the first protrusion and the first region can be lengthened more than when the first protrusion is not formed between the electrode pads. Therefore, the first protrusion can be disposed in a region which vibration displacement energy of thickness shear vibration by the first region does not reach. Accordingly, in the resonator element, it is possible to reduce the influence of the first protrusion on the vibration of the first region. As a result, it is possible to reduce deterioration in electric characteristics.

Application Example 2

In the resonator element according to the application example, when Lz is a length of the first protrusion along the Z' axis and Mz is a length of the first region along the Z' axis, a relation of "0<Lz/Mz≤0.7" may be satisfied.

In the resonator element, it is possible to reduce equivalent series resistance.

Application Example 3

In the resonator element according to the application example, the first protrusion may be disposed in a region which vibration displacement energy by the vibration section does not reach.

In the resonator element, it is possible to reduce the influence of the first protrusion on the vibration of the first region, and thus it is possible to reduce the deterioration in the electric characteristics.

Application Example 4

In the resonator element according to the application example, the first protrusion may have two side surfaces extending along the Z' axis. Of the two side surfaces, one side surface may be disposed at a position of one maximum amplitude of the flexural vibration and the other side surface may be disposed at a position of the other maximum amplitude of the flexural vibration.

In the resonator element, it is possible to attenuate the thickness shear vibration in the peripheral section while reducing the flexural vibration, and thus it is possible to efficiently trap the vibration displacement energy of the thickness shear vibration.

Application Example 5

The resonator element according to the application example may further include a pair of second protrusions that are disposed to be lined in the direction oriented along the Z' axis at the other end side of the second region along the X axis.

In the resonator element, it is possible to reduce the deterioration in the electric characteristics of the resonator element, and it is possible to reduce a possibility of the first region colliding against, for example, the package on which the resonator element is mounted and damaging.

Application Example 6

In the resonator element according to the application example, the first region may include a first portion and a second portion that has a thickness thinner than the first portion and is present between the first portion and the second region at least in a vibration direction of the thickness shear vibration in a plan view.

In the resonator element, it is possible to reduce the deterioration in the electric characteristics of the resonator element, and it is possible to realize an energy trapped effect of the thickness shear vibration in the first region.

Application Example 7

The resonator element according to the application example may further include excitation electrodes that are formed in the first and second regions.

In the resonator element, it is possible to excite the quartz crystal substrate by the excitation electrode.

Application Example 8

A resonator according to this application example includes the resonator element according to the application example and a package in which the resonator element is accommodated.

Since the resonator includes the resonator element according to the application example, it is possible to reduce the deterioration in the electric characteristics.

Application Example 9

A resonator device according to this application example includes: the resonator element according to the application example; and an electronic element.

Since the resonator device includes the resonator element according to the application example, it is possible to reduce the deterioration in the electric characteristics.

Application Example 10

In the resonator device according to the application example, the electronic element may be a thermosensitive element.

Since the resonator device includes the resonator element according to the application example, it is possible to reduce the deterioration in the electric characteristics.

Application Example 11

An oscillator according to this application example includes: the resonator element according to the application example; and an oscillation circuit that is electrically connected to the resonator element.

Since the oscillator includes the resonator element according to the application example, it is possible to reduce the deterioration in the electric characteristics.

Application Example 12

An electronic apparatus according to this application example includes the resonator element according to the application example.

Since the electronic apparatus includes the resonator element according to the application example, it is possible to reduce the deterioration in the electric characteristics.

Application Example 13

A moving object according to this application example includes the resonator element according to the application example.

Since the moving object includes the resonator element according to the application example, it is possible to reduce the deterioration in the electric characteristics.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail with reference to the drawings. The embodiments to be described below do not inappropriately limit content of the invention described in the appended claims. All of the configurations to be described below may not be said to be indispensable configuration prerequisites.

1. Resonator Element

Figure 1:
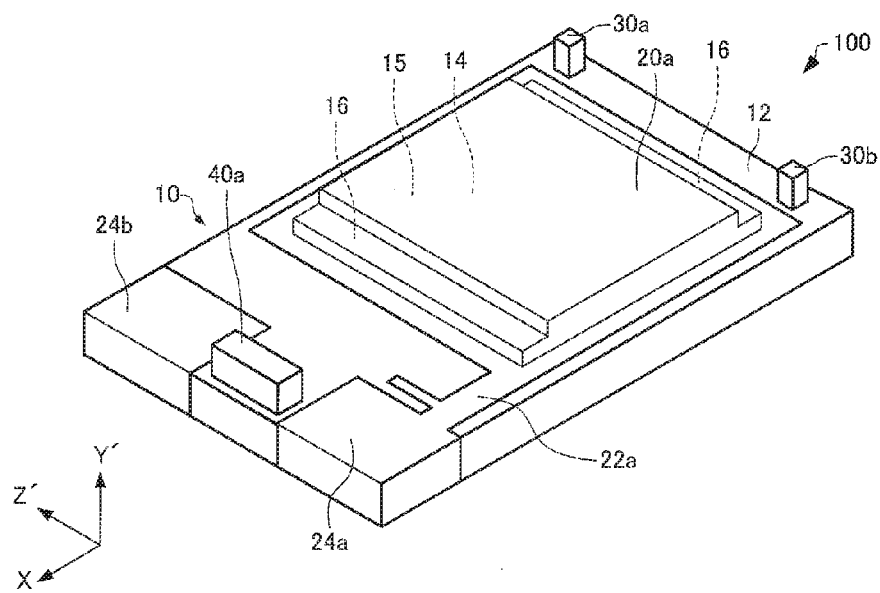
FIG. 1 is a perspective view schematically illustrating a resonator element according to an embodiment.
Figure 2:
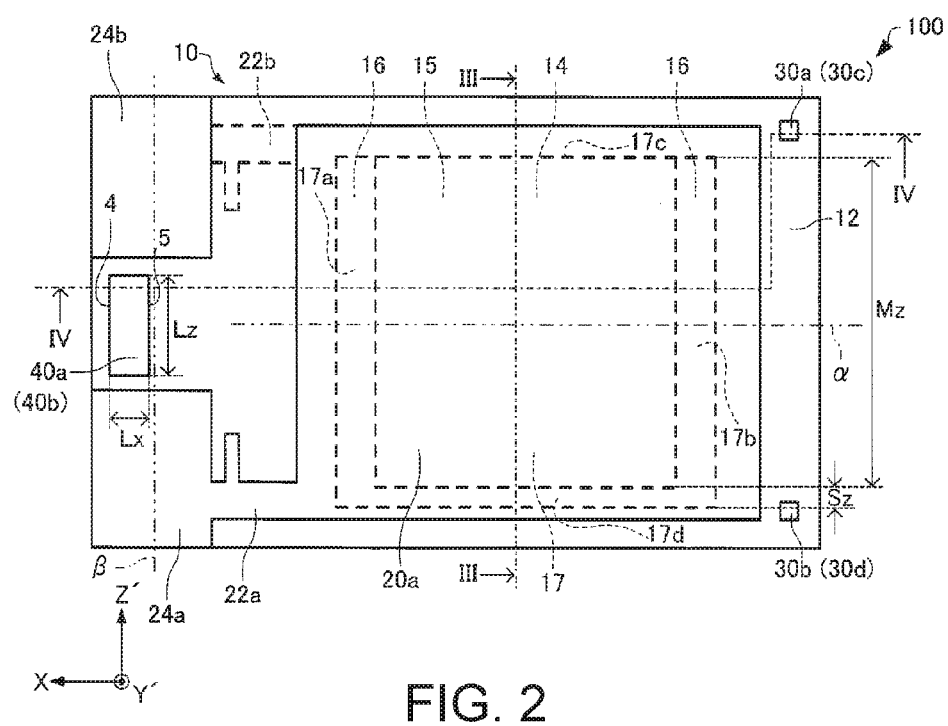
FIG. 2 is a plan view schematically illustrating the resonator element according to the embodiment.
Figure 3:
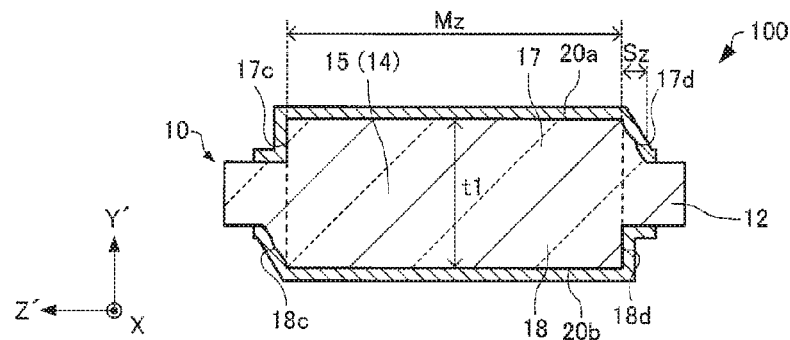
FIG. 3 is a sectional view schematically illustrating the resonator element according to the embodiment.
Figure 4:
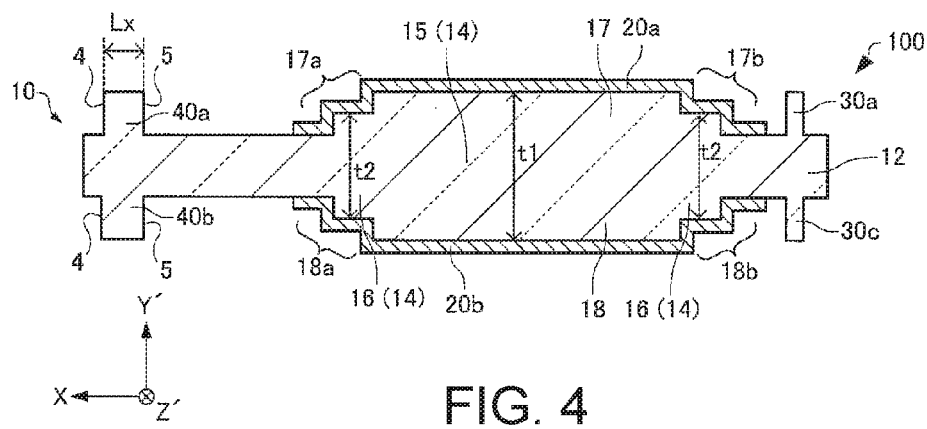
FIG. 4 is a sectional view schematically illustrating the resonator element according to the embodiment.

First, a resonator element according to an embodiment will be described with reference to the drawings. FIG. 1 is a perspective view schematically illustrating a resonator element 100 according to the embodiment. FIG. 2 is a plan view schematically illustrating the resonator element 100 according to the embodiment. FIG. 3 is a sectional view taken along the line III-III of FIG. 2 schematically illustrating the resonator element 100 according to the embodiment. FIG. 4 is a sectional view taken along the line IV-IV of FIG. 2 schematically illustrating the resonator element 100 according to the embodiment.

As illustrated in FIGS. 1 to 4, the resonator element 100 includes a quartz crystal substrate 10 and excitation electrodes 20a and 20b.

The quartz crystal substrate 10 is configured as an AT-cut quartz crystal substrate. Here, FIG. 5 is a perspective view schematically illustrating an AT-cut quartz crystal substrate 101.

Figure 5:
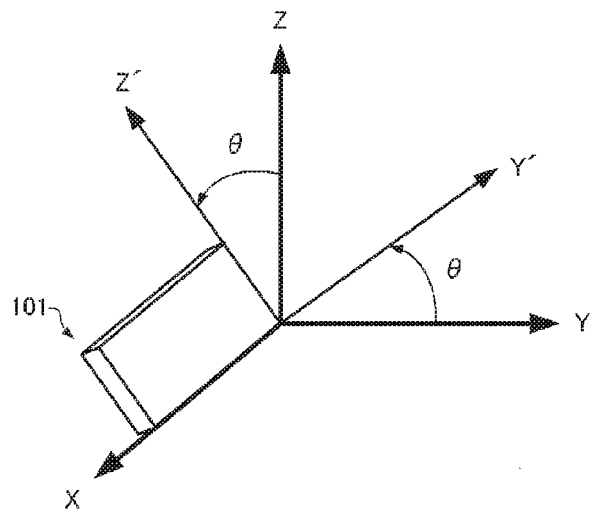
FIG. 5 is a perspective view schematically illustrating an AT-cut quartz crystal substrate.

A piezoelectric material such as quartz crystal is generally a trigonal system and has quartz crystal axes (X, Y, and Z), as illustrated in FIG. 5. The X axis is an electric axis, the Y axis is a mechanical axis, and the Z axis is an optical axis. The quartz crystal substrate 101 is a flat substrate which is a so-called rotational Y-cut quartz crystal substrate cut out from a piezoelectric material (for example, a synthetic crystal) along a fat plane rotated from the XZ plane (which is a plane including the X and Z axes) by an angle θ around the X axis. The Y and Z axes are also rotated by θ around the X axis to form Y' and Z' axes, respectively. The quartz crystal substrate 101 is a substrate that has a plane including the X and Z' axes as a main plane and has a thickness in the direction oriented along the Y' axis. Here, when θ=35°15' is set, the quartz crystal substrate 101 is an AT-cut quartz crystal substrate. Accordingly, in the AT-cut quartz crystal substrate 101, an XZ' plane (which is a plane including the X and Z' axes) perpendicular to the Y' axis is a main plane (a main plane of a vibration section) and thickness shear vibration can be realized as main vibration. The quartz crystal substrate 10 can be obtained by processing the AT-cut quartz crystal substrate 101.

As illustrated in FIG. 5, the quartz crystal substrate 10 is configured as an AT-cut quartz crystal substrate in which the X axis of the orthogonal coordinate system having the X axis serving as an electric axis, the Y axis serving as a mechanical axis, and the Z axis serving as an optical axis, which are crystallographic axes of quartz crystal, is set as a rotation axis, an axis inclined from the Z axis so that the +Z side is rotated in the -Y direction of the Y axis is set as a Z' axis, an axis inclined from the Y axis so that the +Y side is rotated in the +Z direction of the Z axis is set as a Y' axis, a plane including the X and Z' axes is set as a main plane, and the direction oriented along the Y' axis is set as a thickness direction. In FIGS. 1 to 4 and FIGS. 6 to 11 to be described below, the X, Y', and Z' axes orthogonal to each other are illustrated.

For example, as illustrated in FIG. 2, the quartz crystal substrate 10 has a rectangular shape in which a direction (Y' axis direction) oriented along the Y' axis is set as a thickness direction, a direction (X axis direction) oriented in the X axis is set as a long side in a plan view from the Y' axis direction (hereinafter simply referred to as the "plan view"), and a direction (Z' axis direction) oriented along the Z' axis is set as a short side. The quartz crystal substrate 10 includes a peripheral section (second region) 12 and a vibration section (first region) 14.

As illustrated in FIG. 2, the peripheral section 12 is formed in the periphery of the vibration section 14. The peripheral section 12 is formed along the outer frame of the vibration section 14. The peripheral section 12 has a thickness thinner than the vibration section 14 (the thickness is thinner than that of the vibration section 14).

As illustrated in FIG. 2, in the plan view, the vibration section 14 is surrounded by the peripheral section 12 and has a thickness thicker than the peripheral section 12. The vibration section 14 has a side oriented along the X axis and a side oriented along the Z' axis. Specifically, the vibration section 14 has a rectangular shape in which a long side is formed in the X axis direction and a short side is formed in the Z' axis direction in the plan view. The vibration section 14 includes a first portion 15 and a second portion 16.

The first portion 15 of the vibration section 14 has a thickness thicker than the second portion 16. In an example illustrated in FIGS. 3 and 4, the first portion 15 is a portion that has a thickness t1. The first portion 15 has a quadrangular shape in the plan view.

The second portion 16 of the vibration section 14 has a thickness thinner than the first portion 15. In the illustrated example, the second portion 16 is a portion that has a thickness t2. The second portion 16 is formed in the +X direction of the X axis (+X axis direction) and the -X direction of the X axis (-X axis direction) of the first portion 15. That is, the first portion 15 is interposed between the second portions 16 in the X axis direction. As described above, the vibration section 14 includes two types of portions 15 and 16 having different thicknesses. Thus, the resonator element 100 can be said to have a two-stage mesa structure.

The vibration section 14 can vibrate so that thickness shear vibration is main vibration. Since the vibration section 14 has the two-stage mesa structure, the resonator element 100 can have an energy trapped effect. The "thickness shear vibration" refers to vibration in which a displacement direction of a quartz crystal substrate is parallel to a main plane of the quartz crystal substrate (in the illustrated example, the displacement direction of the quartz crystal substrate is the X axis direction) and a wave propagation direction is the thickness direction of the quartz crystal substrate.

As illustrated in FIGS. 3 and 4, the vibration section 14 includes a first projection portion 17 projecting from the peripheral section 12 in the +Y' direction of the Y' axis (+Y' axis direction) and a second projection portion 18 projecting from the peripheral section 12 in the -Y' direction of the Y' axis (-Y' axis direction). For example, the projection portions 17 and 18 have the same shape. The projection portions 17 and 18 have the same size.

On a side surface 17a of the first projection portion 17 in the +X axis direction and a side surface 17b of the first projection portion 17 in the -X axis direction and on a side surface 18a of the second projection portion 18 in the +X axis direction and a side surface 18b of the second projection portion 18 in the -X axis direction, as illustrated in FIG. 4, for example, two step differences are formed due to a difference between the thickness of the first portion 15 and the thickness of the second portion 16 or a difference between the thickness of the second portion 16 and the thickness of the peripheral section 12.

A side surface 17c of the first projection portion 17 in the +Z' direction of the Z' axis (the +Z' axis direction) is, for example, a vertical surface to a plane including the X axis and the Z' axis, as illustrated in FIG. 3. Aside surface 17d of the first projection portion 17 in the -Z' direction of the Z' axis (the -Z' axis direction) is, for example, a surface inclined with respect to the plane including the X axis and the Z' axis.

A side surface 18c of the second projection portion 18 in the +Z' axis direction is, for example, a surface inclined with respect to the plane including the X axis and the Z' axis, as illustrated in FIG. 3. A side surface 18d of the second projection portion 18 in the -Z' axis direction is a plane vertical to the plane including the X axis and the Z' axis.

The side surface 17d of the first projection portion 17 and the side surface 18c of the second projection portion 18 are formed as inclined surfaces with respect to the plane including the X axis and the Z' axis, for example, when an m surface of quartz crystal is exposed by performing an etching process on the AT-cut quartz crystal substrate using a solution containing a hydrofluoric acid as an etchant. Although not illustrated, other side surfaces of the quartz crystal substrate 10 in the -Z' direction other than the side surfaces 17d and 18c may also be formed as inclined surfaces with respect to the plane including the X axis and the Z' axis by exposing the m surface of the quartz crystal.

Figure 6:
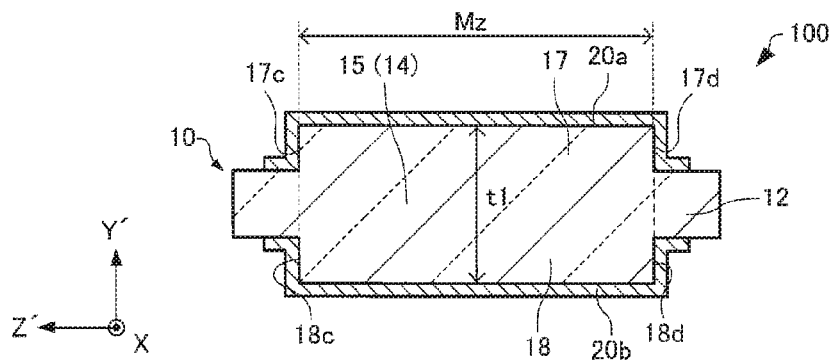
FIG. 6 is a sectional view schematically illustrating the resonator element according to the embodiment.

As illustrated in FIG. 6, the side surfaces 17d and 18c may be vertical surfaces to the plane including the X axis and the Z' axis. For example, by processing the AT-cut quartz crystal substrate by a laser or etching AT-cut quartz crystal substrate by dry etching, the side surfaces 17d and 18c can be formed as vertical surfaces to the plane including the X axis and the Z' axis. For convenience, FIG. 1 illustrates the side surfaces 17d and 18c which are the vertical surfaces to the plane including the X axis and the Z' axis.

In the resonator element 100, as illustrated in FIG. 2, when Sz is the length of the side surfaces 17d and 18c along the Z' axis and Mz is the length of the vibration section 14 along the Z' axis in the plan view, for example, formula (1) below is satisfied. Here, Mz is the size of a flat portion (specifically, the plane including the X axis and the Z' axis) of the vibration section 14 in the Z' axis direction.

$$0 \leq Sz/Mz \leq 0.05 \quad (1)$$

When Sz/Mz=0, as illustrated in FIG. 6, the side surfaces 17d and 18c are vertical to the plane including the X axis and the Z' axis.

The first excitation electrode 20a and the second excitation electrode 20b are formed to overlap each other in the plan view of the vibration section 14. In the illustrated example, the excitation electrodes 20a and 20b are also formed in the peripheral section 12. For example, the shapes of the excitation electrodes 20a and 20b in the plan view (the shapes when viewed in the Y' axis direction) are rectangular. The vibration section 14 is formed inside the outer frames of the excitation electrodes 20a and 20b in the plan view. That is, the areas of the excitation electrodes 20a and 20b are greater than the area of the vibration section 14 in the plan view. The excitation electrodes 20a and 20b are electrodes that apply a voltage to the vibration section 14.

The first excitation electrode 20a is connected to the first electrode pad 24a via a first extraction electrode 22a. The second excitation electrode 20b is connected to the second electrode pad 24b via a second extraction electrode 22b. For example, the electrode pads 24a and 24b are electrically connected to an IC chip (not illustrated) that drives the resonator element 100. The electrode pads 24a and 24b are formed on the side of the peripheral section 12 in the +X axis direction. The excitation electrodes 20a and 20b, the extraction electrodes 22a and 22b, and the electrode pads 24a and 24b are formed, for example, by stacking chromium and gold in this order from the side of the quartz crystal substrate 10.

The quartz crystal substrate 10 includes second protrusions 30a, 30b, 30c, and 30d and first protrusions 40a and 40b.

As illustrated in FIGS. 1 and 2, the second protrusions 30a and 30b are formed to be lined on both sides of a middle region of the peripheral section 12, that is, in the direction oriented along the Z' axis, on a free end side of the peripheral section 12 (the other end side of the peripheral section 12 in the direction oriented along the X axis). Here, the resonator element 100 is fixed to another member (for example, a package) in the electrode pads 24a and 24b. Accordingly, in the resonator element 100, the side of the electrode pads 24a and 24b of the peripheral section 12 (the side in the +X axis direction in the illustrated example) is a mounting side (fixing end side and one end side of the peripheral section 12 in the direction oriented along the X axis) and the opposite side (the side in the -X axis direction in the illustrated example) is the free end side. In the example illustrated in FIG. 2, the second protrusions 30a and 30b are disposed on both sides of the middle region of the peripheral section 12 (for example, both sides of an imaginary straight line α parallel to the X axis passing through the center of the quartz crystal substrate 10 in the plan view) on the side of the peripheral section 12 in the -X axis direction. The second protrusions 30a and 30b are formed on the surface of the peripheral section 12 in the +Y' axis direction.

The second protrusions 30c and 30d are formed on the surface of the peripheral section 12 in the -Y' axis direction, as illustrated in FIG. 4. In the plan view, the second protrusion 30c is formed to overlap the second protrusion 30a and the second protrusion 30d is formed to overlap the second protrusion 30b.

For example, the shapes of the second protrusions 30a, 30b, 30c, and 30d are rectangular parallelepipeds. For example, the thicknesses of the second protrusions 30a, 30b, 30c, and 30d are the same as the thicknesses of the projection portions 17 and 18.

As illustrated in FIGS. 1 and 2, the first protrusion 40*a* is formed between one pair of electrode pads 24*a* and 24*b* formed on the mounting side of the peripheral section 12. In the example illustrated in FIG. 2, the first protrusion 40*a* is formed in the +X axis direction from an imaginary straight line β connecting the center of the first electrode pad 24*a* to the center of the second electrode pad 24*b* in the plan view. The first protrusion 40*a* is disposed in a row with the vibration section 14 in a displacement direction (the X axis direction in the illustrated example) of the thickness shear vibration of the vibration section 14. The first protrusion 40*a* is formed on the surface of the peripheral section 12 in the +Y' axis direction.

The first protrusion 40*b* is formed on the surface of the peripheral section 12 in the –Y' axis direction. In the plan view, the first protrusion 40*b* is formed to overlap the first protrusion 40*a*.

For example, the shapes of the first protrusions 40*a* and 40*b* are rectangular parallelepipeds that have side surfaces 4 and 5 extending along the Z' axis. In the illustrated example, the side surface 4 is a surface oriented in the +X axis direction and the side surface 5 is a surface oriented in the –X axis direction. For example, the thicknesses of the first protrusions 40*a* and 40*b* are the same as the thicknesses of the first protrusions 30*a*, 30*b*, 30*c*, and 30*d*.

Figure 7:
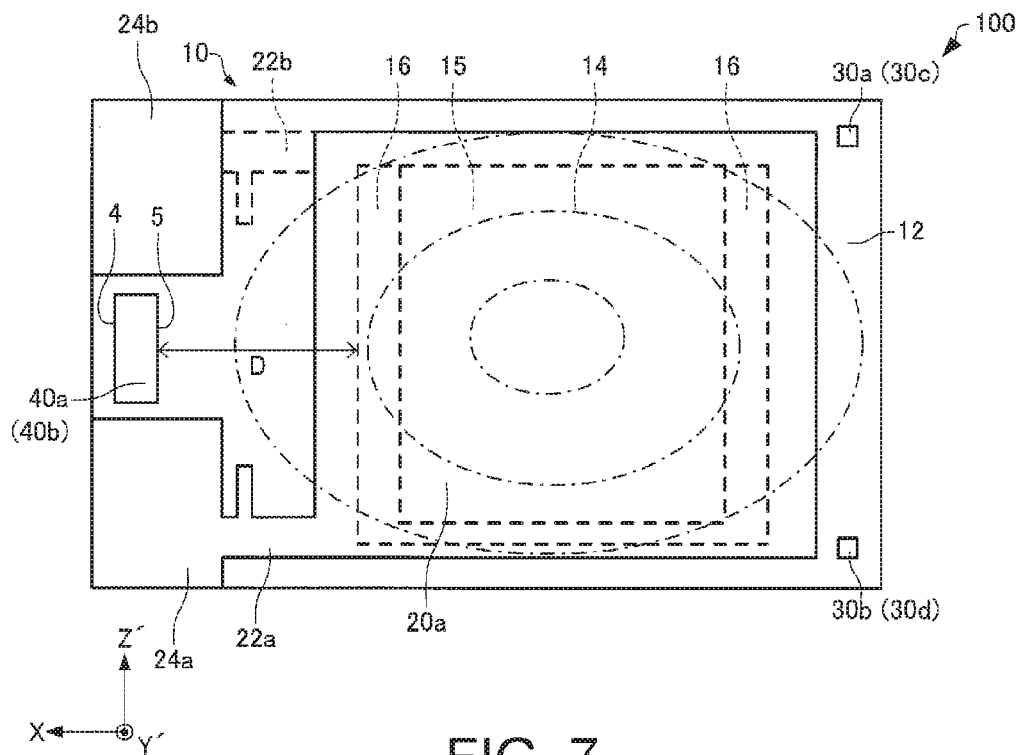
FIG. 7 is a plan view schematically illustrating the resonator element according to the embodiment.

Here, FIG. 7 is a schematic diagram in which isodynamic lines connecting points at which vibration displacement energy (a product of a square of vibration displacement and amass at that position) generated at the time of excitation of the resonator element 100 overlap with a plan view schematically illustrating the resonator element 100 by one-dot chain lines. That is, the one-dot chain lines illustrated in FIG. 7 show a distribution of the vibration displacement energy. As illustrated in FIG. 7, the first protrusions 40*a* and 40*b* are disposed in regions which the vibration displacement energy of the thickness shear vibration by the vibration section 14 does not reach. That is, at the positions at which the first protrusions 40*a* and 40*b* are formed, the vibration displacement energy of the thickness shear vibration by the vibration section 14 is zero. A distance D between the first protrusions 40*a* and 40*b* and the vibration section 14 is, for example, equal to or greater than 200 μm and equal to or less than 300 μm.

In the resonator element 100, when Lx is the length (the length along the X axis) of the first protrusions 40*a* and 40*b* in the displacement direction of the thickness shear vibration of the first protrusions 40*a* and 40*b* and λ is a wavelength of flexural vibration generated in the quartz crystal substrate 10, a relation of formula (2) below is satisfied.

"$\lambda/2 \times (2n+1) - 0.1\lambda \leq Lx \leq \lambda/2 \times (2n+1) + 0.1\lambda$ (where $n$ is a positive integer) (2)

The "wavelength of the flexural vibration generated in the quartz crystal substrate 10" is a wavelength of flexural vibration which is spurious (unnecessary vibration) generated in the quartz crystal substrate 10. For example, the wavelength λ of the flexural vibration can be obtained by a mathematical formula such as "$\lambda/2 = (1.332/f) - 0.0024$" where a resonance frequency of the resonator element 100 is f.

In formula (2), "$-0.1\lambda$" and "$+0.1\lambda$" indicate a variation (manufacturing variation) in the dimensions. The influence on the resonator element 100 can be set to be sufficiently small in the manufacturing variation. Specifically, the flexural vibration can be reduced to be sufficiently small in the manufacturing variation.

Figure 8:
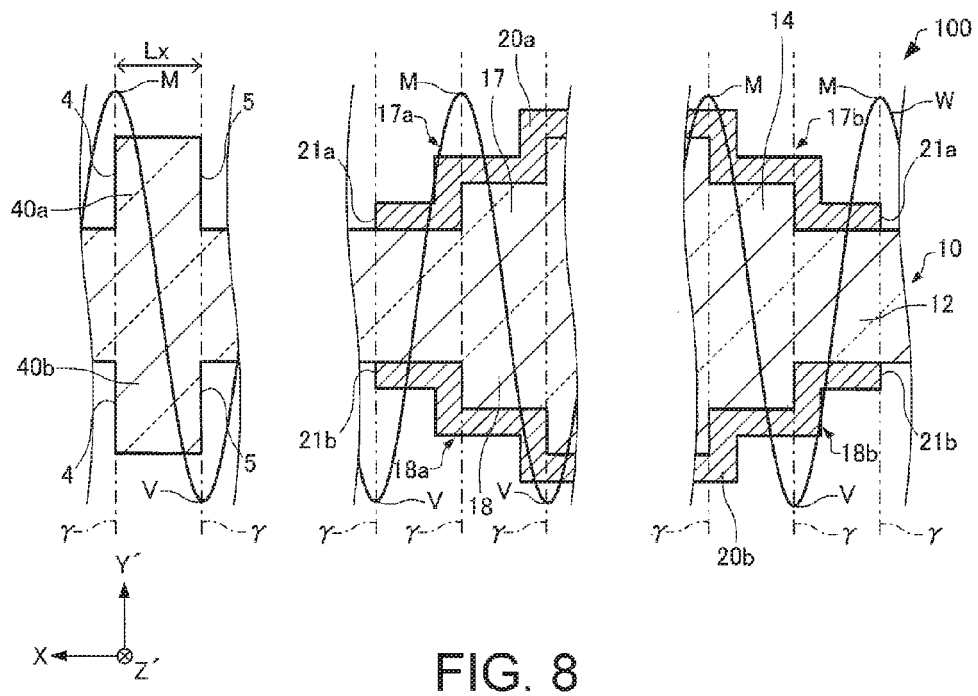
FIG. 8 is a sectional view schematically illustrating the resonator element according to the embodiment.

By satisfying formula (2), as illustrated in FIG. 8, the side surfaces 4 and 5 of the first protrusions 40*a* and 40*b* can be formed to match positions of the maximum amplitude (a peak M or a trough V) of the flexural vibration generated in the quartz crystal substrate 10. In the example illustrated in FIG. 8, the side surface 4 is disposed at the peak M of the flexural vibration generated in the quartz crystal substrate 10 and the side surface 5 is disposed at the trough V of the flexural vibration generated in the quartz crystal substrate 10. Specifically, the side surfaces 4 and 5 are formed such that a parallel to the Y' axis passing through the maximum amplitude point (the peak M or the trough V) of the wavelength W of the flexural vibration generated in the quartz crystal substrate 10 matches an imaginary straight line γ. Although not illustrated, the side surface 4 may be disposed at the trough V of the flexural vibration and the side surface 5 may be disposed at the peak M of the flexural vibration. FIG. 8 is a schematic diagram in which the amplitude of the flexural vibration generated in the quartz crystal substrate 10 overlaps with a plan view schematically illustrating the resonator element 100.

In the example illustrated in FIG. 8, a Y'Z' plane (which is a plane including the Y' axis and the Z' axis) including the side surfaces 17*a* and 17*b* of the first projection portion 17, a Y'Z' plane including the side surfaces 18*a* and 18*b* of the second projection portion 18, and end surfaces 21*a* and 21*b* of the excitation electrodes 20*a* and 20*b* are formed to also match the positions of the maximum amplitude of the flexural vibration generated in the quartz crystal substrate 10.

Figure 9:
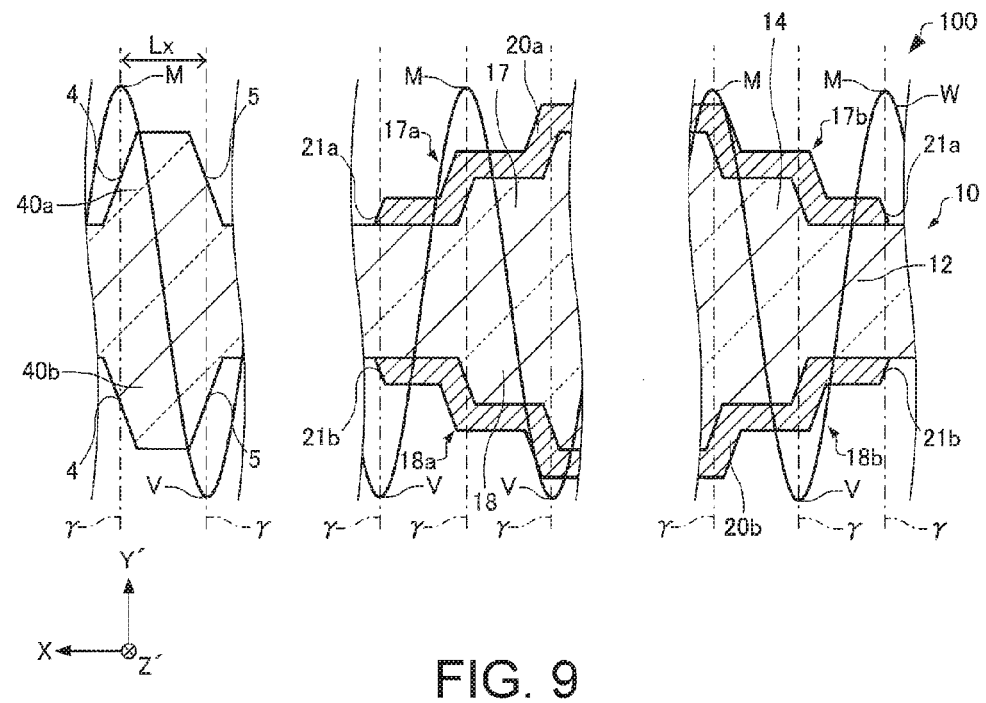
FIG. 9 is a sectional view schematically illustrating the resonator element according to the embodiment.

For example, when the quartz crystal substrate is processed by wet etching, as illustrated in FIG. 9, the side surfaces 4 and 5 of the first protrusions 40*a* are inclined with respect to the surface of the peripheral section 12 in the +Y' axis direction by etching anisotropy. In this case, the length Lx is a center distance between the two inclined side surfaces, as illustrated in FIG. 9. This is not limited to the length of the first protrusion 40*a*, but the same applies for the length (for example, Mz or Lz) of each portion of the quartz crystal substrate 10 included in the resonator element according to the invention. In this case, "the side surfaces 4 and 5 of the first protrusion 40*a* are formed to match the positions of the maximum amplitude of the flexural vibration generated in the quartz crystal substrate 10" means that the centers of the inclined side surfaces 4 and 5 are formed to match the positions of the maximum amplitude of the flexural vibration generated in the quartz crystal substrate 10, as illustrated in FIG. 9.

In the resonator element 100, as illustrated in FIG. 2, when Lz is the length of the first protrusions 40*a* and 40*b* along the Z' axis and Mz is the length of the vibration section 14 along the Z' axis, formula (3) below is preferably satisfied.

$0 < Lz/Mz \leq 0.7$ (3)

By satisfying formula (3), it is possible to reduce equivalent series resistance (which will be described below in detail in "Experimental Example"). Specifically, Lz is about 0.07 mm.

In a method of manufacturing the resonator element 100, for example, the quartz crystal substrate 10 is formed by photolithography and etching. The etching may be dry etching or wet etching. The protrusions 30*a*, 30*b*, 30*c*, 30*d*, 40*a*, and 40*b* may be formed simultaneously with the vibration section 14. The excitation electrodes 20*a* and 20*b*, the extraction electrodes 22*a* and 22*b*, and the electrode pads 24*a* and 24*b* (hereinafter also referred to as "the excitation electrodes 20a and 20b and the like") are formed, for example, by forming conductor layers (not illustrated) by a sputtering method or a vacuum evaporation method and patterning the conductor layers by photolithography and etching.

Figure 10:
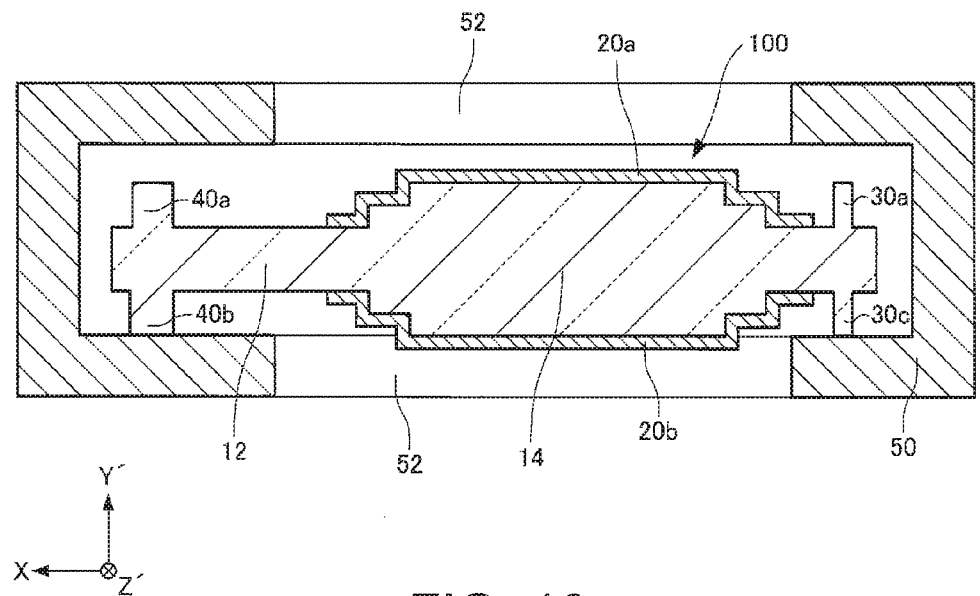
FIG. 10 is a sectional view schematically illustrating a process of manufacturing the resonator element according to the embodiment.

The method of manufacturing the resonator element 100 includes a cleaning step of cleaning the resonator element 100 after the excitation electrodes 20a and 20b and the like are formed. For example, as illustrated in FIG. 10, the cleaning step is performed by accommodating the resonator element 100 in a jig 50 and flowing water (for example, pure water) from an opening 52 formed in the jig 50. The resonator element 100 is accommodated in the jig 50 without contact of the peripheral section 12, the vibration section 14, and the excitation electrodes 20a and 20b with the jig 50 by the protrusions 30c, 30d, and 40b. In the cleaning step, foreign matters attached to the resonator element 100 can be removed. The cleaning step may also be performed before the excitation electrodes 20a and 20b and the like are formed and after the quartz crystal substrate 10 is formed.

The resonator element 100 has, for example, the following characteristics.

The resonator element 100 includes the first protrusions 40a and 40b formed between the one pair of electrode pads 24a and 24b. Since the electrode pads 24a and 24b are formed to include edges (corners) of the peripheral section 12 in the +X axis direction, the distance between the first protrusions 40a and 40b and the vibration section 14 can be lengthened by forming the first protrusions 40a and 40b between the electrode pads 24a and 24b more than when the first protrusions are not formed between the electrode pads. Therefore, the first protrusions 40a and 40b can be disposed in the regions which the vibration displacement energy of the thickness shear vibration by the vibration section 14 does not reach. Accordingly, in the resonator element 100, it is possible to reduce the influence of the first protrusions 40a and 40b on the vibration of the vibration section 14. As a result, it is possible to reduce deterioration in electric characteristics.

The resonator element 100 further includes the second protrusions 30a, 30b, 30c, and 30d formed on the free end side of the peripheral section 12. Therefore, in the cleaning step of cleaning the resonator element 100, the resonator element 100 can be accommodated in the jig 50 without contact of the vibration section 14 or the excitation electrodes 20a and 20b to the jig 50. For example, when the first protrusions are not formed between the electrode pads, a distance between the first protrusions and the opening formed in the jig is close. Thus, when the resonator element is moved with respect to the jig during the cleaning, the first protrusions fall to the opening in some cases. Furthermore, for example, when the second protrusions 30a, 30b, 30c, and 30d of the resonator element 100 come into contact with a package (a package accommodating the resonator element 100), it is possible to prevent the vibration section 14 or the excitation electrodes 20a and 20b from colliding against the package and damaging. As a result, the resonator element 100 can have, for example, high reliability.

The resonator element 100 satisfies formula (2). Therefore, in the resonator element 100, one side of the side surfaces 4 and 5 can be disposed at the peak of the flexural vibration and the other side of the side surfaces 4 and 5 can be disposed at the trough of the flexural vibration. Accordingly, in the resonator element 100, it is possible to attenuate the thickness shear vibration in the peripheral section 12 while reducing the flexural vibration, and thus it is possible to efficiently trap the vibration displacement energy of the thickness shear vibration.

The example has been described above in which the areas of the excitation electrodes 20a and 20b are greater than the area of the vibration section 14 in the plan view. However, in the resonator element according to the invention, the areas of the excitation electrodes 20a and 20b may be less than the area of the vibration section 14 in the plan view. In this case, the excitation electrodes 20a and 20b are formed inside the outer frame of the vibration section 14 in the plan view.

The two-stage mesa structure in which the vibration section 14 has the two types of portions 15 and 16 having different thicknesses has been described above. However, the number of stages of the mesa structure of the resonator element according to the invention is not particularly limited. For example, the resonator element according to the invention may have a three-stage mesa structure in which the vibration section includes three types of portions having different thicknesses or may have a one-stage mesa structure in which the vibration section has no portion with a different thickness.

The example has been described above in which a step difference is not formed by a difference between the thickness of the first portion 15 and the thickness of the second portion 16 in the side surfaces 17c and 17d of the first projection portion 17 and the side surfaces 18c and 18d of the second projection portion 18. However, in the resonator element according to the invention, a step difference (a step difference between the thickness of the first portion 15 and the thickness of the second portion 16) may be formed in the side surfaces 17c, 17d, 18c, and 18d.

The example has been described above in which the resonator element includes the first projection portion 17 projecting from the peripheral section 12 in the +Y' axis direction and the second projection portion 18 projecting from the peripheral section 12 in the −Y' axis direction. However, the resonator element according to the invention may include only one of the projection portions.

The example in which the vibration section 14 has the rectangular shape in the plan view has been described above. However, the vibration section of the resonator element according to the invention may be chamfered edges (corners) in the plan view. That is, the vibration section may have the rectangular shape with cut-out corners.

The example in which the quartz crystal substrate 10 is the AT-cut quartz crystal substrate has been described above. However, in the resonator element according to the invention, the quartz crystal substrate is not limited to the AT-cut quartz crystal substrate, but may be a piezoelectric substrate in which thickness shear vibration is generated, such as an SC-cut quartz crystal substrate or a BT-cut quartz crystal substrate.

2. Modification Examples of Resonator Element

Figure 11:
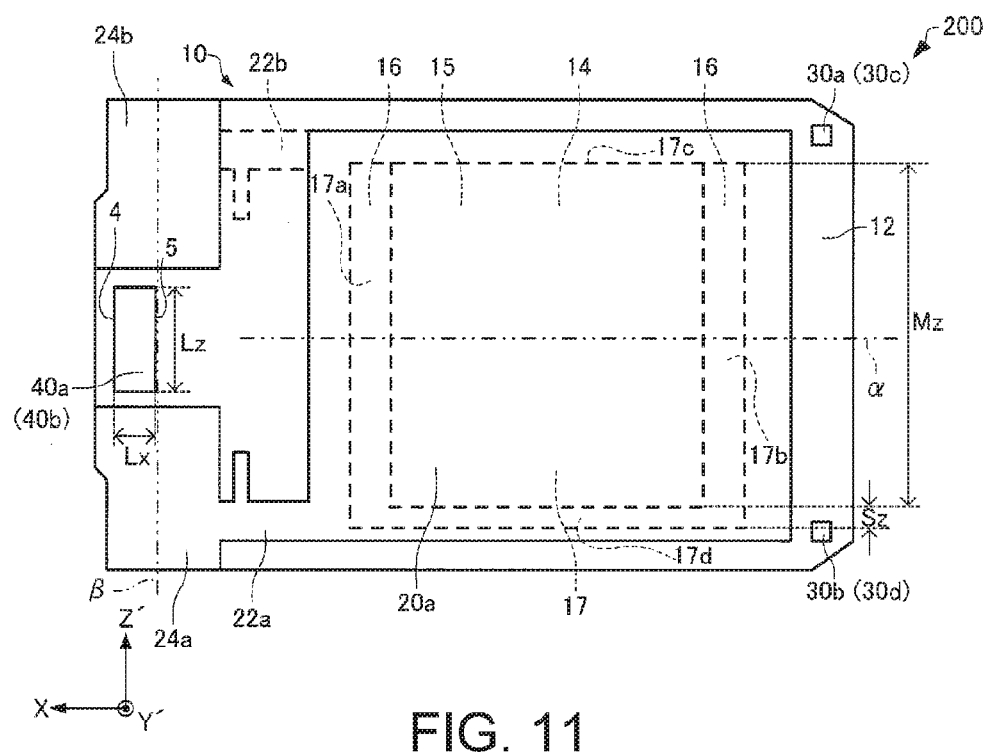
FIG. 11 is a plan view schematically illustrating the resonator element according to a modification example of the embodiment.

Next, a resonator element according to a modification example of the invention will be described with reference to the drawings. FIG. 11 is a plan view schematically illustrating a resonator element 200 according to the modification example of the embodiment. Hereinafter, in the resonator element 200 according to the modification example of the embodiment, the same reference numerals are given to elements having the same functions as the constituent elements of the resonator element 100 according to the embodiment and the detailed description thereof will be omitted.

In the above-described resonator element 100, as illustrated in FIG. 2, the quartz crystal substrate 10 has a rectangular shape in the plan view. Accordingly, in the resonator element 200, as illustrated in FIG. 11, edges (corners) of the quartz crystal substrate 10 in the −X axis direction are chamfered. In other words, the resonator element has a shape in which the rectangular corners are cut out. For example, edges (corners) of the quartz crystal substrate 10 in the +X axis direction may also be chamfered.

In the resonator element 200, the edges of the quartz crystal substrate 10 are chamfered. Therefore, when the quartz crystal substrate 10 is formed by etching, it is possible to reduce generation of burr (for example, etching residue). Further, when the resonator element 200 is mounted on a package, it is possible to reduce a possibility of the corners of the quartz crystal substrate 10 coming into contact with the package and damaging.

3. Experimental Example

Hereinafter, the invention will be described more specifically according to an experimental example. The invention is not limited to the following experimental example.

In the experimental example, the same resonator element as the above-described resonator element 200 was manufactured. Specifically, the resonator element in which the length of the quartz crystal substrate 10 along the X axis was about 1 mm, the length of the quartz crystal substrate 10 along the Z' axis was about 0.6 mm, and the resonance frequency was about 26 MHz was manufactured. In the resonator element, a CI value was measured by changing the length Lz of the first protrusions 40a and 40b along the Z' axis and the length Mz of the vibration section 14 along the Z' axis. The dimensions Lz and Mz were measured by a dimension measurement device and the CI value was measured using a network analyzer.

Figure 12:
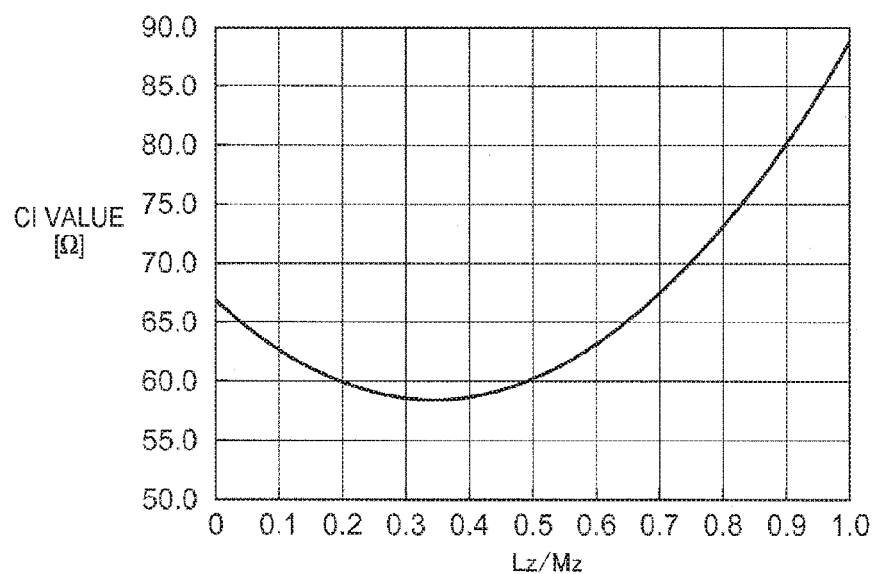
FIG. 12 is a graph illustrating a CI value of the resonator element according to an experimental example.

FIG. 12 is a graph illustrating a relation between a ratio (Lz/Mz) of Lz to Mz and the CI value. As illustrated in FIG. 12, by satisfying the relation of "0<Lz/Mz≤0.7", it can be understood that the CI value can be suppressed to a value less than 70Ω. By satisfying a relation of "0.1≤Lz/Mz≤0.6", it can be understood that the CI value can be suppressed to a value less than 65Ω. By satisfying a relation of "0.2≤Lz/Mz≤0.5", it can be understood that the CI value can be suppressed to smaller values less than 65Ω. By satisfying a relation of "0.3≤Lz/Mz≤0.4", it can be understood that the CI value can be suppressed to a value less than 60Ω.

4. Resonator

Figure 13:
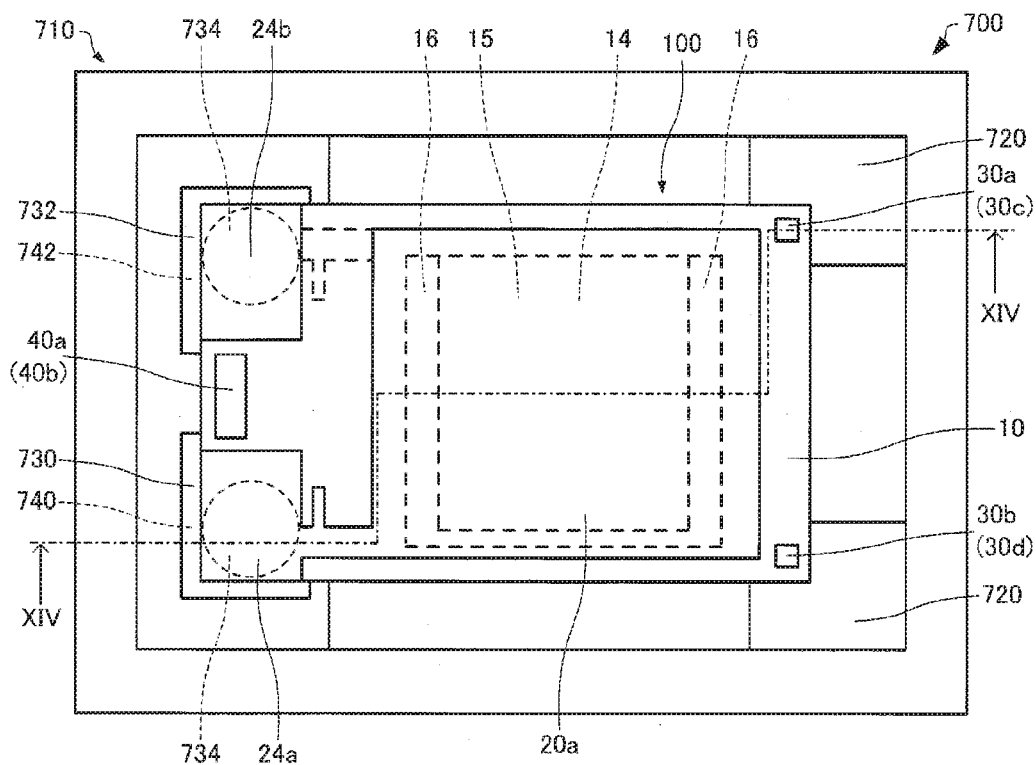
FIG. 13 is a plan view schematically illustrating a resonator according to the embodiment.
Figure 14:
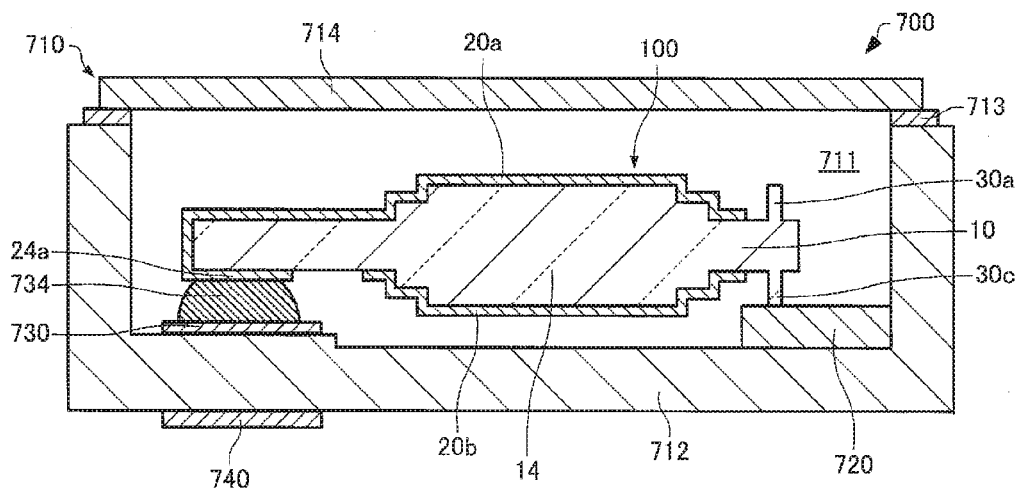
FIG. 14 is a sectional view schematically illustrating the resonator according to the embodiment.

Next, a resonator according to the embodiment will be described with reference to the drawings. FIG. 13 is a plan view schematically illustrating a resonator 700 according to the embodiment. FIG. 14 is a sectional view taken along the line XIV-XIV of FIG. 13 schematically illustrating the resonator 700 according to the embodiment. For convenience, a seal ring 713 and a lid 714 are not illustrated in FIG. 13.

The resonator 700 includes a resonator element according to the invention. Hereinafter, the resonator 700 including the resonator element 100 as the resonator element according to the invention will be described. As illustrated in FIGS. 13 and 14, the resonator 700 includes the resonator element 100 and a package 710.

The package 710 includes a box-shaped base 712 that has a concave portion 711 of which the top surface is opened and a plate-shaped lid 714 that is joined to the base 712 to close the opening of the concave portion 711. The package 710 has an accommodation space formed so that the concave portion 711 is closed with the lid 714, and thus the resonator element 100 is accommodated to be installed in the accommodation space so that the resonator element 100 is airtight. That is, the resonator element 100 is accommodated in the package 710.

For example, the accommodation space (the concave portion 711) in which the resonator element 100 is accommodated may be in a depressurized state (preferably, a vacuum state) or an inert gas such as nitrogen, helium, or argon may be enclosed. Accordingly, the vibration characteristics of the resonator element 100 are improved.

As the material of the base 712, for example, any of various ceramics such as aluminum oxide can be used. As the material of the lid 714, for example, a material with a close linear expansion coefficient to the material of the base 712 can be used. Specifically, when the material of the base 712 is a ceramic, the material of the lid 714 is an alloy such as Kovar.

The bonding of the base 712 and the lid 714 is performed by forming the seal ring 713 on the base 712, mounting the lid 714 on the seal ring 713, and welding the seal ring 713 to the base 712 using, for example, a resistance welder. The bonding of the base 712 and the lid 714 is not particularly limited, but may be performed using an adhesive or may be performed by seam welding.

A pillow portion 720 is formed on the bottom surface of the concave portion 711 of the package 710. For example, the pillow portion 720 is formed to come into contact with the second protrusions 30c and 30d of the resonator element 100. For example, the material of the pillow portion 720 is the same as the material of the base 712. The pillow portion 720 may be integrated with the base 712. For example, even when an impact is applied to the resonator 700 from the outside, the pillow portion 720 and the second protrusions 30c and 30d come into contact with each other, and thus it is possible to prevent the vibration section 14 of the resonator element 100 from colliding against the concave portion 711 of the package 710 and damaging. Further, for example, before the vibration section 14 collides against the lid 714, the second protrusions 30c and 30d collide against the lid 714. Therefore, it is possible to prevent the vibration section 14 from damaging.

A first connection terminal 730 and a second connection terminal 732 are formed on the bottom surface of the concave portion 711 of the package 710. The first connection terminal 730 is formed to face the first electrode pad 24a of the resonator element 100. The second connection terminal 732 is formed to face the second electrode pad 24b of the resonator element 100. The connection terminals 730 and 732 are electrically connected to the electrode pads 24a and 24b via a conductive fixing member 734, respectively.

A first external terminal 740 and a second external terminal 742 are formed on the bottom surface (the bottom surface of the base 712) of the package 710. For example, the first external terminal 740 is formed at a position overlapping the first connection terminal 730 in the plan view. For example, the second external terminal 742 is formed at a position overlapping the second connection terminal 732 in the plan view. The first external terminal 740 is electrically connected to the first connection terminal 730 through a via (not illustrated). The second external terminal 742 is electrically connected to the second connection terminal 732 through a via (not illustrated).

As the connection terminals 730 and 732 and the external terminals 740 and 742, for example, metal coating films formed by stacking coating films of Ni (nickel), Au (gold), Ag (silver), Cu (copper), or the like on metalized layers (underlying layers) of Cr (chromium), W (tungsten), or the like are used. As the conductive fixing member 734, for example, a solder, a silver paste, a conductive adhesive (an adhesive in which conductive fillers such as metal particles are dispersed in a resin material), or the like is used.

Since the resonator 700 includes the resonator element 100, it is possible to reduce deterioration in the electric characteristics.

5. Resonator Device

Figure 15:
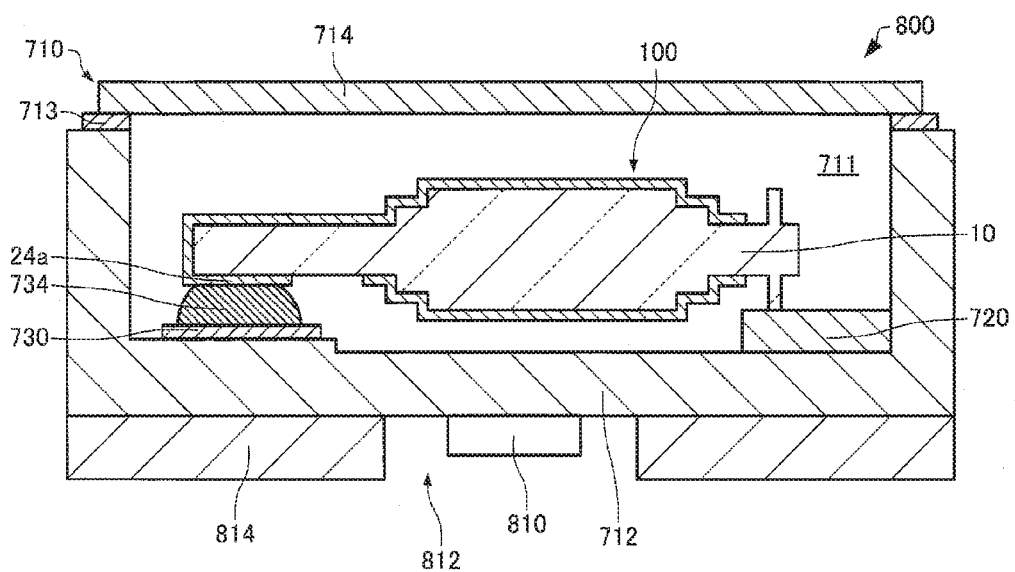
FIG. 15 is a sectional view schematically illustrating a resonator device according to the embodiment.

Next, a resonator device according to the embodiment will be described with reference to the drawings. FIG. 15 is a sectional view schematically illustrating a resonator device 800 according to the embodiment.

Hereinafter, in the resonator device 800 according to the embodiment, the same reference numerals are given to elements having the same functions as the constituent elements of the above-described resonator 700 according to the embodiment and the detailed description thereof will be omitted.

The resonator device 800 includes the resonator element according to the invention. Hereinafter, a resonator device 800 including the resonator element 100 as the resonator element according to the invention will be described. The resonator device 800 includes the resonator element 100, the package 710, and a thermosensitive element (electronic element) 810, as illustrated in FIG. 15.

The package 710 includes an accommodation portion 812 that accommodates the thermosensitive element 810. For example, the accommodation portion 812 can be formed by forming a frame-shaped member 814 on the bottom surface of the base 712.

The thermosensitive element 810 is, for example, a thermistor in which a physical quantity, for example, electric resistance, is changed according to a change in temperature. The electric resistance of the thermistor can be detected by an external circuit to measure detection temperature of the thermistor.

Another electric component may be accommodated in the accommodation space (the concave portion 711) of the package 710. As the electric component, an IC chip or the like controlling driving of the resonator element 100 can be exemplified.

Since the resonator device 800 includes the resonator element 100, it is possible to reduce the deterioration in the electric characteristics.

6. Modification Examples of Resonator Device

6.1. First Modification Example

Figure 16:
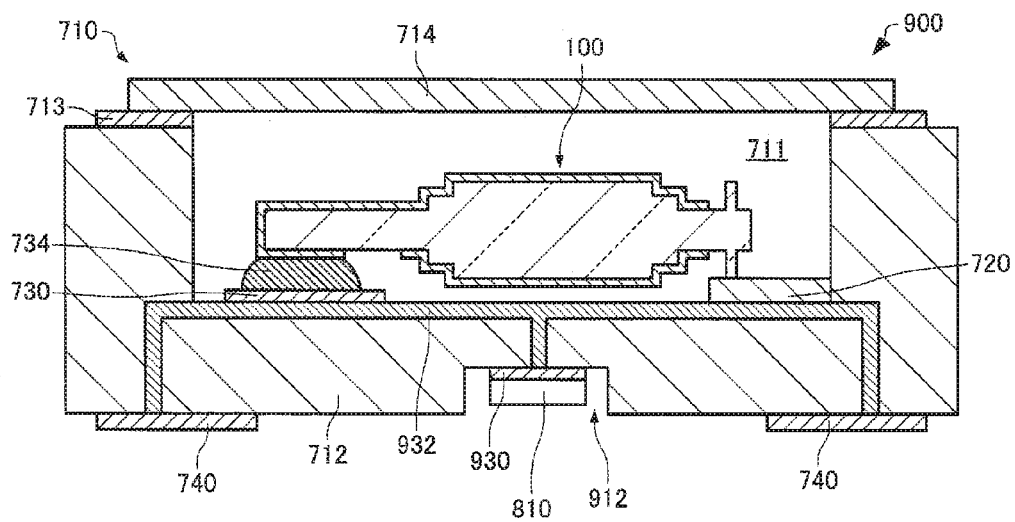
FIG. 16 is a sectional view schematically illustrating a resonator device according to a first modification example of the embodiment.

Next, a resonator device according to a first modification example of the embodiment will be described with reference to the drawing. FIG. 16 is a sectional view schematically illustrating a resonator device 900 according to the first modification example of the embodiment.

Hereinafter, in the resonator device 900 according to the first modification example of the embodiment, the same reference numerals are given to elements having the same functions as the constituent elements of the above-described resonator device 800 according to the embodiment and the detailed description thereof will be omitted.

In the above-described resonator device 800, as illustrated in FIG. 15, the accommodation portion 812 that accommodates a thermosensitive element 810 is formed by forming a frame-shaped member 814 on the bottom surface of the base 712.

On the other hand, in the resonator device 900, as illustrated in FIG. 16, the thermosensitive element 810 is accommodated in a concave portion 912 by forming the concave portion 912 on the bottom surface (the bottom surface of the base 712) of the package 710. In the illustrated example, a third connection terminal 930 is formed on the bottom surface of the concave portion 912 and the thermosensitive element 810 is formed under a third connection terminal 930 via a metal bump or the like. In the illustrated example, the third connection terminal 930 is connected to a wiring 932 formed in the base 712. The third connection terminal 930 is electrically connected to the first external terminal 740 and the first connection terminal 730 by the wiring 932. For example, the material of the third connection terminal 930 is the same as the material of the connection terminal 730 or 732. The material of the wiring 932 is not particularly limited as long as the material is conductive.

Since the resonator device 900 includes the resonator element 100, it is possible to reduce the deterioration in the electric characteristics.

6.2. Second Modification Example

Figure 17:
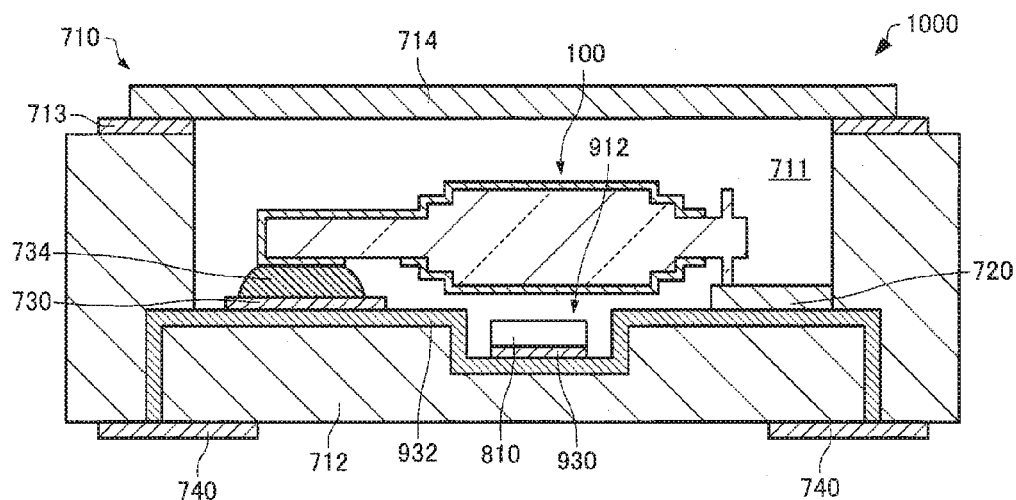
FIG. 17 is a sectional view schematically illustrating a resonator device according to a second modification example of the embodiment.

Next, a resonator device according to a modification example of the embodiment will be described with reference to the drawing. FIG. 17 is a sectional view schematically illustrating a resonator device 1000 according to a second modification example of the embodiment.

Hereinafter, in the resonator device 1000 according to the second modification example of the embodiment, the same reference numerals are given to elements having the same functions as the constituent elements of the above-described resonator devices 800 and 900 according to the embodiment and the detailed description thereof will be omitted.

In the resonator device 800, as illustrated in FIG. 15, the accommodation portion 812 that accommodates the thermosensitive element 810 is formed for the thermosensitive element 810 by forming the frame-shaped member 814 on the bottom surface side of the base 712.

On the other hand, in the resonator device 1000, as illustrated in FIG. 17, the concave portion 912 is formed on the bottom surface (upper surface of the base 712) of the concave portion 711 and the thermosensitive element 810 is accommodated in the concave portion 912. The thermosensitive element 810 is formed on the third connection terminal 930.

Since the resonator device 1000 includes the resonator element 100, it is possible to reduce the deterioration in the electric characteristics.

7. Oscillator

Figure 18:
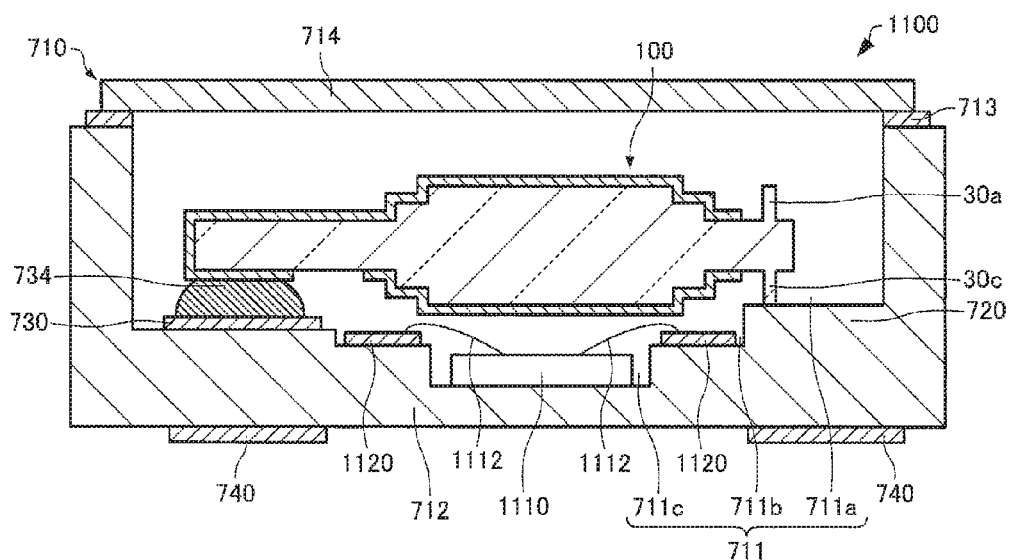
FIG. 18 is a sectional view schematically illustrating an oscillator according to the embodiment.

Next, an oscillator according to the embodiment will be described with reference to the drawing. FIG. 18 is a sectional view schematically illustrating an oscillator 1100 according to the embodiment.

Hereinafter, in the oscillator 1100 according to the embodiment, the same reference numerals are given to elements having the same functions as the constituent elements of the above-described resonator 700 according to the embodiment and the detailed description thereof will be omitted.

The oscillator 1100 includes the resonator element according to the invention. Hereinafter, the oscillator 1100 including the resonator element 100 as the resonator element according to the invention will be described. As illustrated in FIG. 18, the oscillator 1100 includes the resonator element 100, the package 710, and an IC chip (chip component) 1110.

In the oscillator 1100, the concave portion 711 includes a first concave portion 711a formed on the top surface of the base 712, a second concave portion 711b formed in the middle of the bottom surface of the first concave portion 711a, and a third concave portion 711c formed in the middle of the bottom surface of the second concave portion 711b.

The first connection terminal 730 and the second connection terminal 732 are formed on the bottom surface of the first concave portion 711a. The IC chip 1110 is formed on the bottom surface of the third concave portion 711c. The IC chip 1110 includes a driving circuit (oscillation circuit) that controls driving of the resonator element 100. When the resonator element 100 is driven by the IC chip 1110, vibration of a predetermined frequency can be extracted. The IC chip 1110 overlaps the resonator element 100 in the plan view. As illustrated in FIG. 18, the bottom surface of the first concave portion 711a may also function as the pillow portion 720 coming into contact with the second protrusions 30c and 30d of the resonator element 100.

A plurality of internal terminals 1120 electrically connected to the IC chip 1110 via wires 1112 are formed on the bottom surface of the second concave portion 711b. For example, of the plurality of internal terminals 1120, one internal terminal 1120 is electrically connected to the first connection terminal 730 via a wiring (not illustrated). Of the plurality of internal terminals 1120, the other internal terminals 1120 are electrically connected to the second connection terminal 732 via wirings (not illustrated). Accordingly, the IC chip 1110 is electrically connected to the resonator element 100. The internal terminal 1120 may be electrically connected to the external terminal 740 through a via (not illustrated) formed in the base 712.

Since the oscillator 1100 includes the resonator element 100, it is possible to reduce the deterioration in the electric characteristics.

8. Modification Example of Oscillator

Figure 19:
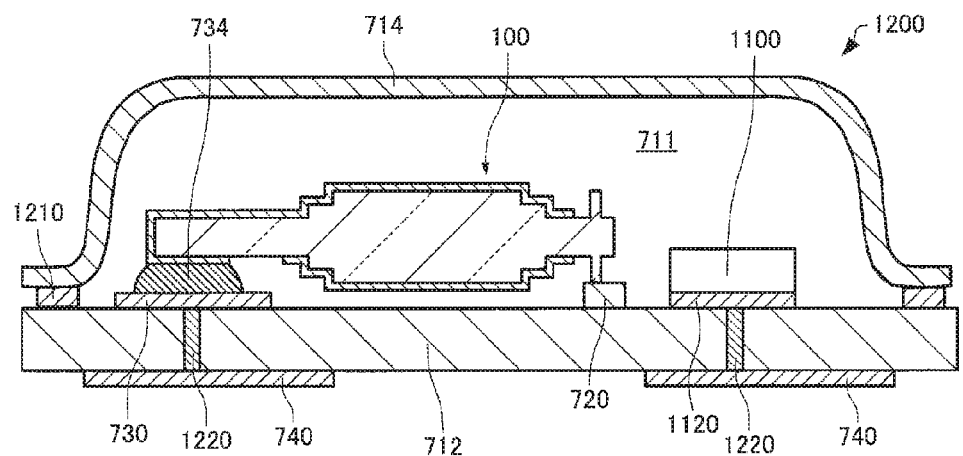
FIG. 19 is a sectional view schematically illustrating an oscillator according to a modification example of the embodiment.

Next, an oscillator according to a modification example of the embodiment will be described with reference to the drawing. FIG. 19 is a sectional view schematically illustrating an oscillator 1200 according to a modification example of the embodiment.

Hereinafter, in the oscillator 1200 according to the modification example of the embodiment, the same reference numerals are given to elements having the same functions as the constituent elements of the above-described oscillator 1100 according to the embodiment and the detailed description thereof will be omitted.

In the above-described oscillator 1100, as illustrated in FIG. 18, the IC chip 1110 overlaps the resonator element 100 in the plan view.

On the other hand, in the oscillator 1200, as illustrated in FIG. 19, the IC chip 1110 does not overlap the resonator element 100 in the plan view. The IC chip 1110 is formed on the side of the resonator element 100.

In the oscillator 1200, the package 710 is configured to include a plate-shaped base 712 and a convex-shaped lid 714. The lid 714 is sealed hermetically by melting a metalized layer 1210 formed in the circumference of the base 712. At this time, a sealing step is performed in a vacuum state so that the inside of the oscillator can be vacuumized. As a sealing mechanism, a mechanism melting and welding the lid 714 using a laser beam or the like may be used.

In the illustrated example, the first connection terminal 730 is electrically connected to the first external terminal 740 through a via 1220 formed in the base 712. The internal terminal 1120 is electrically connected to the first external terminal 740 through the via 1220 formed in the base 712. The internal terminal 1120 is electrically connected to the first connection terminal 730 via a wiring (not illustrated). The IC chip 1110 is formed on the internal terminal 1120 via a metal bump or the like.

Since the oscillator 1200 includes the resonator element 100, it is possible to reduce the deterioration in the electric characteristics.

9. Electronic Apparatus

Next, electronic apparatuses according to the embodiment will be described with reference to the drawings. An electronic apparatus according to the embodiment includes the resonator element according to the invention. Hereinafter, electronic apparatuses including the resonator element 100 as the resonator element according to the invention will be described.

Figure 20:
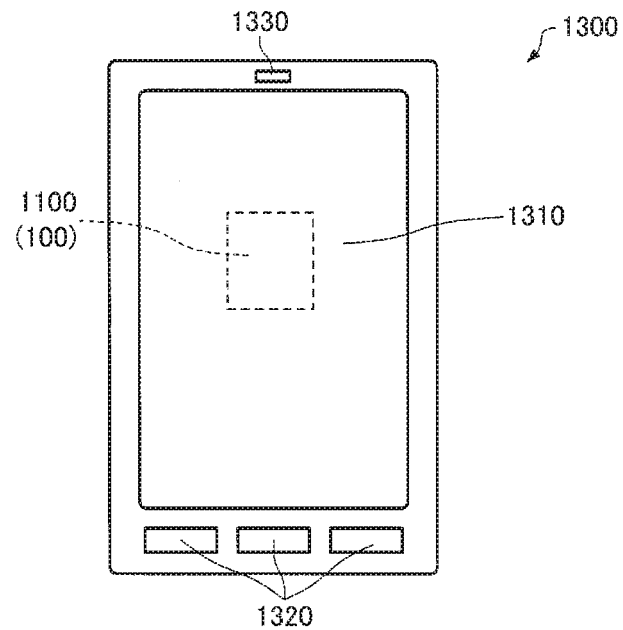
FIG. 20 is a plan view schematically illustrating an electronic apparatus according to the embodiment.

FIG. 20 is a plan view schematically illustrating a smartphone 1300 as the electronic apparatus according to the embodiment. As illustrated in FIG. 20, the smartphone 1300 includes the oscillator 1100 including the resonator element 100.

In the smartphone 1300, the oscillator 1100 is used as, for example, a timing device such as a reference clock oscillation source or the like. The smartphone 1300 can further include a display unit (a liquid crystal display, an organic EL display, or the like) 1310, an operation unit 1320, a sound output unit 1330 (microphone or the like). The smartphone 1300 may include a touch detection mechanism on the display unit 1310 so that the display unit 1310 also serves as an operation unit.

An electronic apparatus typified by the smartphone 1300 preferably includes an oscillation circuit that drives the resonator element 100 and a temperature compensation circuit that corrects a frequency variation occurring with a change in the temperature of the resonator element 100.

Accordingly, the electronic apparatus typified by the smartphone 1300 includes the oscillation circuit that drives the resonator element 100 and the temperature compensation circuit that corrects a frequency variation occurring with a change in the temperature of the resonator element 100, and thus temperature-compensates a resonant frequency oscillated by the oscillation circuit. Therefore, it is possible to provide the electronic apparatus with excellent temperature characteristics.

Figure 21:
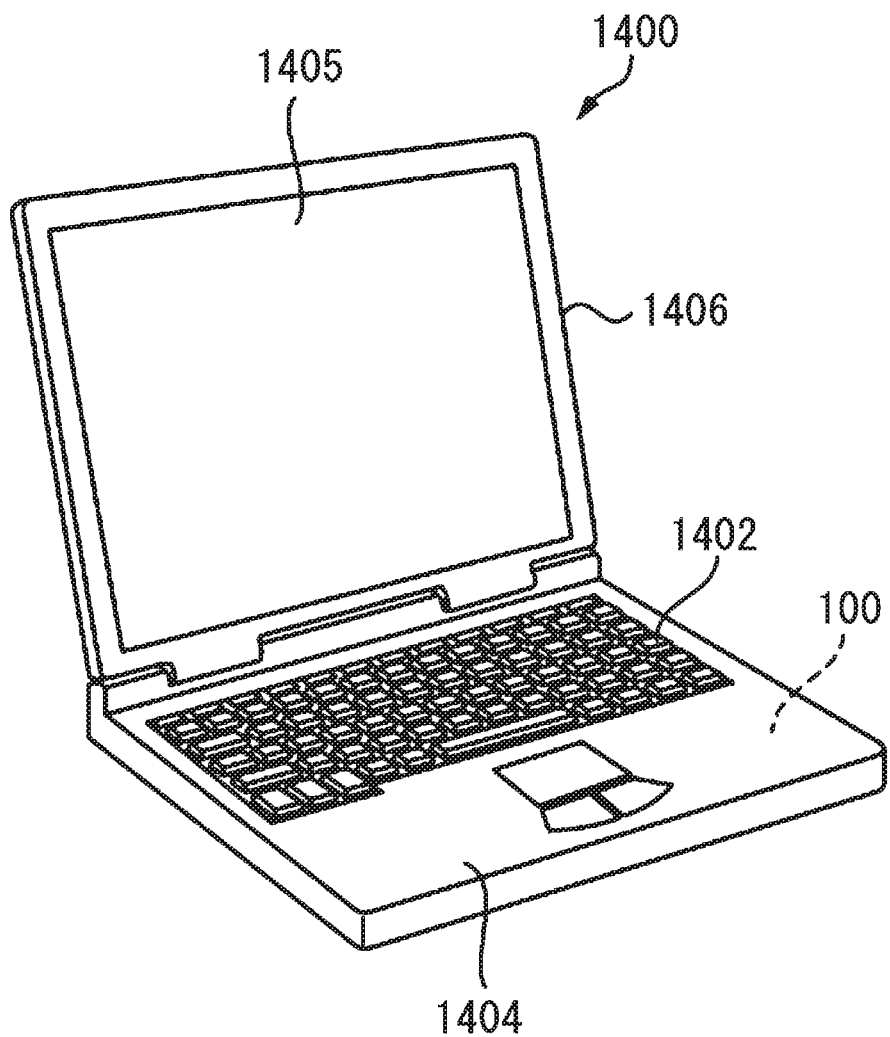
FIG. 21 is a perspective view schematically illustrating an electronic apparatus according to the embodiment.

FIG. 21 is a perspective view schematically illustrating a mobile (or notebook-type) personal computer 1400 as the electronic apparatus according to the embodiment. As illustrated in FIG. 21, the personal computer 1400 is configured to include a body unit 1404 including a keyboard 1402 and a display unit 1406 including a display unit 1405. The display unit 1406 is supported to be rotated via a hinge structure unit with respect to the body unit 1404. In the personal computer 1400, the resonator element 100 functioning as a filter, a resonator, a reference clock, or the like is built.

Figure 22:
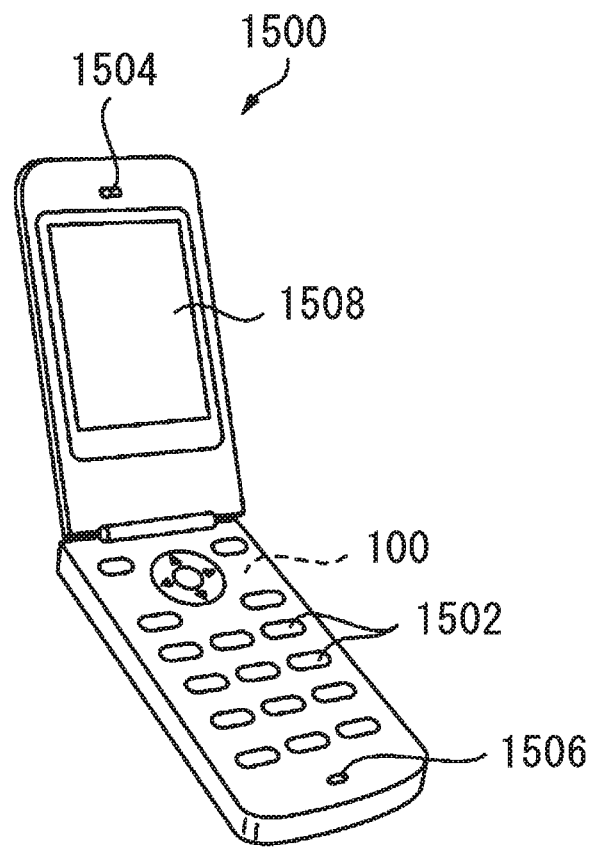
FIG. 22 is a perspective view schematically illustrating an electronic apparatus according to the embodiment.

FIG. 22 is a perspective view schematically illustrating a mobile phone (also including a PHS) 1500 as the electronic apparatus according to the embodiment. The mobile phone 1500 includes a plurality of operation buttons 1502, a earpiece 1504, and a mouthpiece 1506. A display unit 1508 is disposed between the operation buttons 1502 and the earpiece 1504. In the mobile phone 1500, the resonator element 100 functioning as a filter, a resonator, or the like is built.

Figure 23:
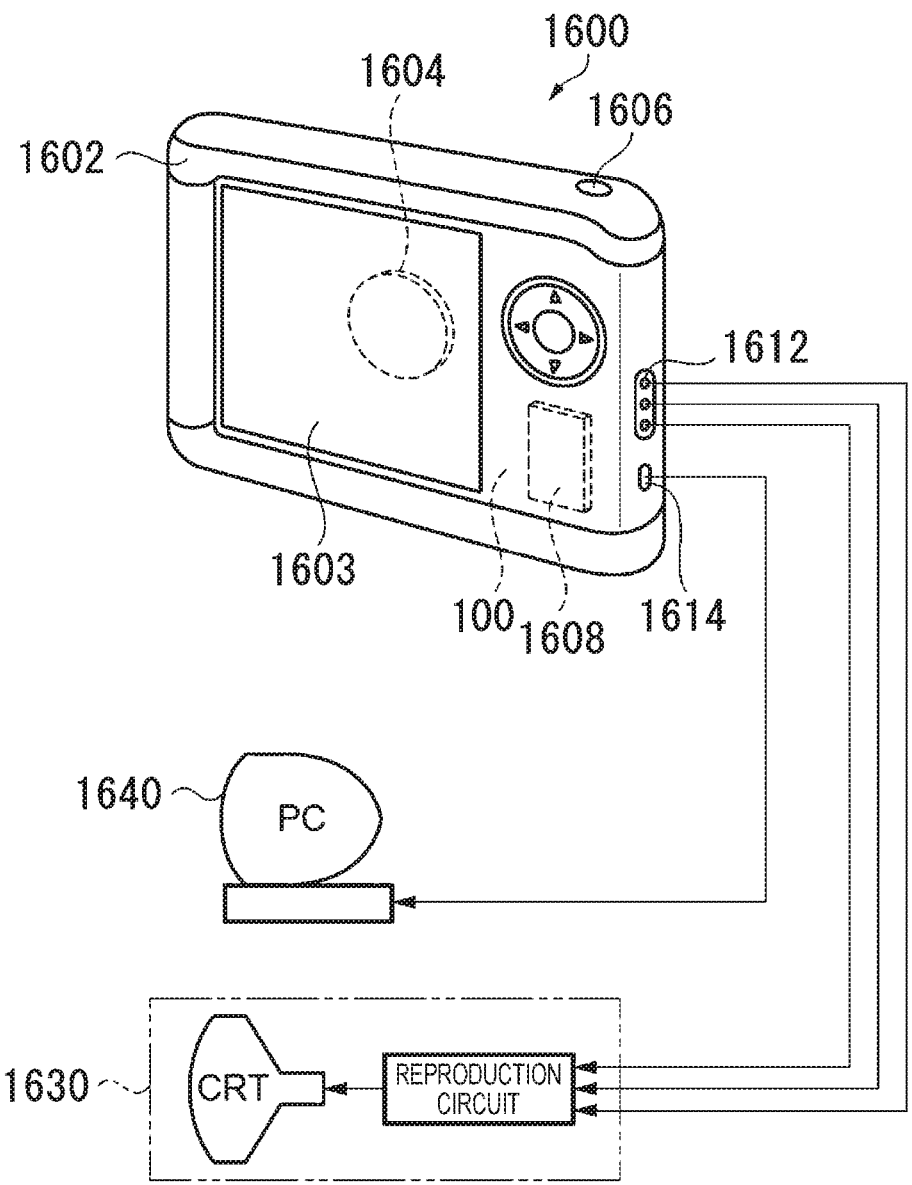
FIG. 23 is a perspective view schematically illustrating an electronic apparatus according to the embodiment.

FIG. 23 is a perspective view schematically illustrating a digital still camera 1600 as the electronic apparatus according to the embodiment. In FIG. 23, connection with an external apparatus is also simply illustrated. Here, a normal camera exposes a silver-salt photo film by a light image of a subject, but the digital still camera 1600 performs photoelectric conversion on a light image of a subject using an image sensor such as a charge coupled device (CCD) and generates an imaging signal (image signal).

A display unit 1603 is formed on the rear surface of a case (body) 1602 of the digital still camera 1600 to perform display based on the imaging signal generated by the CCD. The display unit 1603 functions a finder that displays a subject as an electronic image. A light-receiving unit 1604 including an optical lens (imaging optical system) or a CCD is formed on the front surface (the rear surface side of the drawing) of the case 1602.

When a photographer confirms a subject image displayed on the display unit and presses a shutter button 1606, an imaging signal of the CCD at that time is transmitted and stored in a memory 1608. In the digital still camera 1600, a video signal output terminal 1612 and a data communication input/output terminal 1614 are formed on a side surface of the case 1602. As illustrated, a television monitor 1630 is connected to the video signal output terminal 1612 and a personal computer 1640 is connected to the data communication input/output terminal 1614, as necessary. The imaging signal stored in the memory 1608 is configured to be output to the television monitor 1630 or the personal computer 1640 through a predetermined operation. In the digital still camera 1600, the resonator element 100 functioning as a filter, a resonator, or the like is built.

Since the electronic apparatuses 1300, 1400, 1500, and 1600 include the resonator element 100, it is possible to reduce the deterioration in the electric characteristics.

The electronic apparatus including the resonator element according to the invention is not limited to the foregoing examples, but may be applied to, for example, an ink jet ejection apparatus (for example, an ink jet printer), a laptop personal computer, a television, a video camera, a video tape recorder, a car navigation apparatus, a pager, an electronic organizer (also including a communication function unit), an electronic dictionary, a calculator, an electronic game apparatus, a word processor, a workstation, a television phone, a security television monitor, electronic binoculars, a POS terminal, medical apparatuses (for example, an electronic thermometer, a blood pressure meter, a blood-sugar meter, an electrocardiographic apparatus, an ultrasonic diagnostic apparatus, and an electronic endoscope), a fish finder, various measurement apparatuses, meters (for example, meters for vehicles, airplanes, and ships), and a flight simulator.

10. Moving Object

Figure 24:
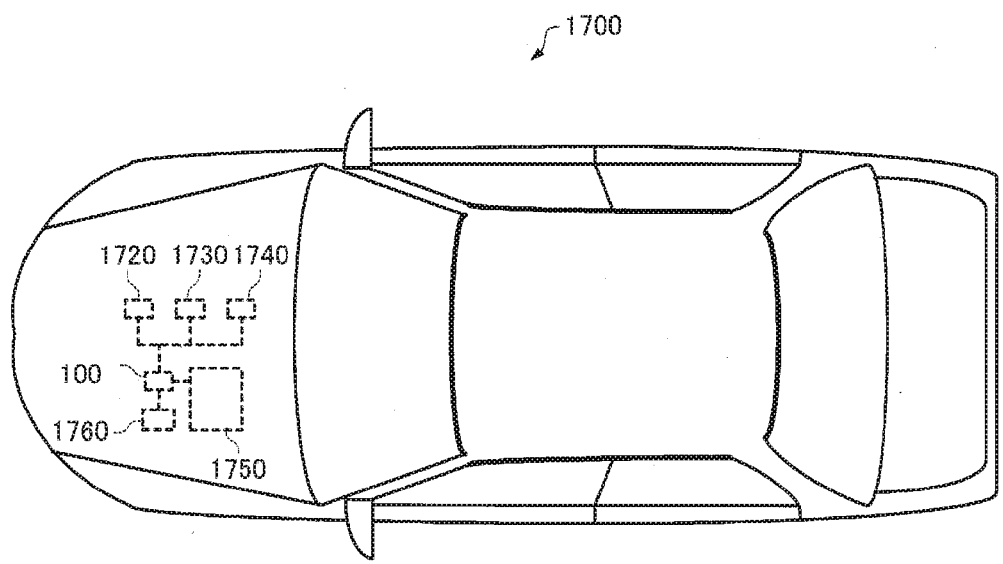
FIG. 24 is a plan view schematically illustrating a moving object according to the embodiment.

Next, a moving object according to the embodiment will be described with reference to the drawing. FIG. 24 is a perspective view schematically illustrating an automobile as a moving object 1700 according to the embodiment.

The moving object according to the embodiment includes the resonator element according to the invention. Hereinafter, a moving object including the resonator element 100 as the resonator element according to the invention will be described.

The moving object 1700 according to the embodiment is configured to further include a controller 1720 that performs various kinds of control on an engine system, a brake system, a keyless entry system, and the like, a controller 1730, a controller 1740, a battery 1750, and a backup battery 1760. In the moving object 1700 according to the embodiment, some of the constituent elements (each unit) illustrated in FIG. 24 may be omitted or changed or other constituent elements may be added.

As the moving object 1700, various moving objects can be considered. For example, an automobile (also including an electric automobile), an airplane such as a jet plane or a helicopter, a ship, a rocket, and an artificial satellite can be exemplified.

Since the moving object 1700 includes the resonator element 100, it is possible to reduce the deterioration in the electric characteristics.

The above-described embodiments and modification examples are merely examples and the invention is not limited thereto. For example, the embodiments and the modification examples can also be appropriately combined.

The invention includes substantially the same configurations (for example, configurations in which the functions, the methods, and the results are the same or configurations in which the goals and the advantages are the same) as the configurations described in the embodiments. The invention includes configurations in which unessential portions of the configurations described in the embodiments are substituted. The invention includes configurations in which the same operation and advantages as the configurations described in the embodiments or configurations in which the same goals can be achieved. The invention includes configurations in which known technologies are added to the configurations described in the embodiments.

The entire disclosure of Japanese Patent Application No. 2015-015325, filed Jan. 29, 2015 is expressly incorporated by reference herein.

What is claimed is:
1. A resonator element comprising:
   a quartz crystal substrate in which an X axis of an orthogonal coordinate system having the X axis serving as an electric axis, a Y axis serving as a mechanical axis, and a Z axis serving as an optical axis, which are crystallographic axes of quartz crystal, is set as a rotation axis, an axis inclined from the Z axis so that a +Z side is rotated in a −Y direction of the Y axis is set as a Z' axis, an axis inclined from the Y axis so that a +Y side is rotated in a +Z direction of the Z axis is set as a Y' axis, a plane including the X and Z' axes is set as a main plane, and the direction oriented along the Y' axis is set as a thickness direction; and
   a pair of electrode pads,
   wherein the quartz crystal substrate includes
      a first region in which thickness shear vibration is generated,
      a second region that is located in periphery of the first region and has a thickness thinner than the first region, and
      a first protrusion that is disposed to be lined with the first region in a direction oriented along the X axis at one end side of the second region along the X axis,
   wherein the one pair of electrode pads are disposed to be lined in a direction oriented along the Z' axis at the one end side of the second region in the direction oriented along the X axis,
   wherein the first protrusion is present between the one pair of electrode pads, and wherein when Lx is a length of the first protrusion along the X axis and $\lambda$ is a wavelength of flexural vibration generated in the quartz crystal substrate, a relation of "$\lambda/2\times(2n+1)-0.1\lambda \leq Lx \leq \lambda/2\times(2n+1)+0.1\lambda$" (where n is a positive integer) is satisfied.

2. The resonator element according to claim 1,
wherein when Lz is a length of the first protrusion along the Z' axis and Mz is a length of the first region along the Z' axis, a relation of "$0<Lz/Mz \leq 0.7$" is satisfied.

3. The resonator element according to claim 1,
wherein the first protrusion is disposed in a region which vibration displacement energy by the vibration section does not reach.

4. The resonator element according to claim 1,
wherein the first protrusion has two side surfaces extending along the Z' axis, and
wherein of the two side surfaces, one side surface is disposed at a position of one maximum amplitude of the flexural vibration and the other side surface is disposed at a position of the other maximum amplitude of the flexural vibration.

5. The resonator element according to claim 1, further comprising:
a pair of second protrusions that are disposed to be lined in the direction oriented along the Z' axis at the other end side of the second region along the X axis.

6. The resonator element according to claim 1,
wherein the first region includes
a first portion, and
a second portion that has a thickness thinner than the first portion and is present between the first portion and the second region at least in a vibration direction of the thickness shear vibration in a plan view.

7. The resonator element according to claim 1, further comprising:
excitation electrodes that are formed in the first and second regions.

8. The resonator element according to claim 2, further comprising:
excitation electrodes that are formed in the first and second regions.

9. The resonator element according to claim 3, further comprising:
excitation electrodes that are formed in the first and second regions.

10. The resonator element according to claim 4, further comprising:
excitation electrodes that are formed in the first and second regions.

11. A resonator comprising:
the resonator element according to claim 1; and
a package in which the resonator element is accommodated.

12. A resonator comprising:
the resonator element according to claim 2; and
a package in which the resonator element is accommodated.

13. A resonator device comprising:
the resonator element according to claim 1; and
an electronic element.

14. A resonator device comprising:
the resonator element according to claim 2; and
an electronic element.

15. The resonator device according to claim 13,
wherein the electronic element is a thermosensitive element.

16. An oscillator comprising:
the resonator element according to claim 1; and
an oscillation circuit that is electrically connected to the resonator element.

17. An oscillator comprising:
the resonator element according to claim 2; and
an oscillation circuit that is electrically connected to the resonator element.

18. An electronic apparatus comprising:
the resonator element according to claim 1.

19. A moving object comprising:
the resonator element according to claim 1.

* * * * *